United States Patent [19]
Wright et al.

[11] Patent Number: 4,770,591
[45] Date of Patent: Sep. 13, 1988

[54] APPARATUS FOR UNLOADING A CONTAINER HAVING A MATRIX OF STORAGE POSITIONS

[75] Inventors: Steven F. Wright, Glen Ellyn; Joseph Wolyn, Gurnee, both of Ill.

[73] Assignee: Molex Incorporated, Lisle, Ill.

[21] Appl. No.: 88,480

[22] Filed: Aug. 19, 1987

Related U.S. Application Data

[63] Continuation of Ser. No. 908,923, Sep. 15, 1986, abandoned, which is a continuation of Ser. No. 703,358, Feb. 20, 1985, abandoned.

[51] Int. Cl.⁴ ............................................. B65G 1/10
[52] U.S. Cl. ................................. 414/331; 221/103; 414/414; 414/422; 414/276; 414/125
[58] Field of Search ............... 221/103, 11; 414/425, 414/414, 610, 611, 376, 276, 331, 125, 422, 330

[56] References Cited

U.S. PATENT DOCUMENTS 3,067,891 12/1962 Anderson ..................... 414/425 X
3,598,279 8/1971 Duffau .............................. 221/11
4,149,641 4/1979 DeVita et al. ................... 414/126
4,222,166 9/1980 Kurek et al. ................. 414/126 X
4,401,234 8/1983 Droira et al. ................ 221/103 X Primary Examiner—Frank E. Werner
Attorney, Agent, or Firm—John W. Cornell; Louis A. Hecht

[57] ABSTRACT

Disclosed is a method and apparatus for discharging serial arrays of solid components contained in a three dimensional matrix of feeding positions, into a delivery track, one serial array at a time. The matrix of feeding positions is comprised of trays each having a row of component containing channels. The trays are stacked one on top of another, and loaded in a box-like container. The container is lowered, presenting one tray at a time to a plurality of funnel-shaped discharge openings. A shuttle, capable of selectively blocking the discharge openings, is aligned with one opening at a time, and is operative to receive a serial array of components contained in a channel aligned with that opening. Upon receiving the components, the shuttle returns to a home position in alignment with the delivery track, whereupon it discharges the components into the track.

The shuttle is indexed along a row of channels, one channel at a time, until the tray is emptied. Thereafter, an adjacent tray containing another row of channels is brought into alignment with the funnel-shaped apertures. The indexing of the shuttle and the trays is repeated until the entire matrix of components is unloaded into the delivery track.

4 Claims, 3 Drawing Sheets

APPARATUS FOR UNLOADING A CONTAINER HAVING A MATRIX OF STORAGE POSITIONS

This application is a continuation of application Ser. No. 908,923 filed Sept. 15, 1986, which is in turn a continuation of application Ser. No. 703,358 filed Feb. 20, 1985, both abandoned.

BACKGROUND OF THE INVENTION

1. Field of the Invention

This invention relates to containers having a matrix of positions for containing electrical connector components and to methods and apparatus for unloading the components from the containers.

2. Brief Description of the Prior Art

There is an ever-increasing need for the automated feeding and terminating of electrical connectors if labor costs are to be reduced and if speed and reliability of manufacture is to be increased. Difficulties encountered in handling a large number of individual electrical connector components contributes to increased manufacturing cost. Since contact spacings and the overall size of electrical connectors are decreasing with a trend toward miniaturization, the problems of shipping, storage and automatic handling of such components are increased.

One type of electrical connector is assembled in stages. In an intermediate condition, terminals associated with the connector are partly inserted into the connector housing. Portions of the terminals extend from the housing and are terminated to conductors before the terminals are fully inserted into a final position within the housing. The connectors may be produced, shipped and stored in the intermediate assembly stage, and then must be oriented and fed to automatic or partly automatic terminating machinery. With this type of connector, problems are encountered not only due to the difficulty of orienting and feeding the connectors, but also due to the vulnerability of the exposed portions of the delicate terminals which extend from the housing in the intermediate assembly condition. Premature insertion of terminals frcm the intermediate to the final position must be prevented.

One arrangement for handling such components is described in U.S. patent application Ser. No. 584,047 filed Feb. 27, 1984 and assigned to the assignee of the present invention. In that arrangement, components are fed to automated terminating equipment or the like from an elongated generally tubular hollow cassette having a uniform cross sectional shape throughout its length. The cross sectional shape of the cassette corresponds to the connector housing profile in one specific housing orientation, and the cassette holds a serial array of such housings. Feeding apparatus for unloading the cassettes includes an arrangement for holding a plurality of cassettes in generally parallel, side-by-side relationship. A component feed path is aligned with and extending away from one of the cassettes from which the serial array of components is pushed into the feed path. Upon emptying the first cassette, advancing means responsive to control signals placed along the feed paths, xove an adjacent second cassette into the unloading station.

The need still exists, however, for even more inexpensive component containing an delivery arrangement. The increasing production rate of current termination equipment requires greater supplies of electronic components if the schedules for loading and stocking the machines is to remain fairly constant.

Also, with the advent of robotic component handling equipment, there is a need to increase the efficient utilization of space immediately surrounding the robotic equipment. Accordingly, component handling systems should be capable of handling a greater density of components, particularly when located in that area.

Also, the economy of manufacture requires that all of the components of a given printed circuit board be robotically inserted on that board. Accordingly, the robotic insertion equipment, and the component feed systems supplying components to that equipment must be capable of readily accommodating a wide variety of component sizes and shapes.

SUMMARY OF THE INVENTION

Accordingly, it is an object of the present invention to provide a component feed system having a high level of through put, being able to accommodate densely packed containers carrying electronic components.

It is another object of the present invention to provide a component feed system which is readily adapted to handle components of varying sizes and shapes.

Yet another object of the present invention is to provide a component feed apparatus which accepts component carrying containers holding a great number of components in a three dimensional array.

These and other objects of the present invention are provided in an apparatus for feeding a plurality of solid components, one at a time, to a delivery track having a loading station, the improvement oomprising:

container means including a matrix array of open-ended component receiving channels, each for holding at least one solid component;

means for indexing said matcix of channels to align a sequence of said channels, one at a tixe, to said loading station; and means for transferring the solid components contained in said channels, one channel at a time, to said loading station.

The present invention also includes a method of feeding a plurality of solid components, one at a time, onto a loading station of a delivery track, wherein the improvement comprises:

a. arranging the plurality of solid components in a matrix of feeding positions;

b. locating the matrix of feeding positions adjacent said loading station;

c. indexing the matrix of feeding positions to present one feeding position adjacent said loading station;

d. transferring the solid components from said adjacent feeding position to said loading station;

e. indexing the matrix so that another feeding position is presented adjacent said loading station;

f. transferring the solid components from said other adjacent feeding position to said loading station; and g. repeating steps e and f until all the feeding positions have been indexed and all the components have been transferred to said loading station.

BRIEF DESCRIPTION OF THE DRAWINGS

In the drawings, wherein like elements are referenced alike.

DETAILED DESCRIPTION OF THE PREFERRED EMBODIMENT

Figure 1:
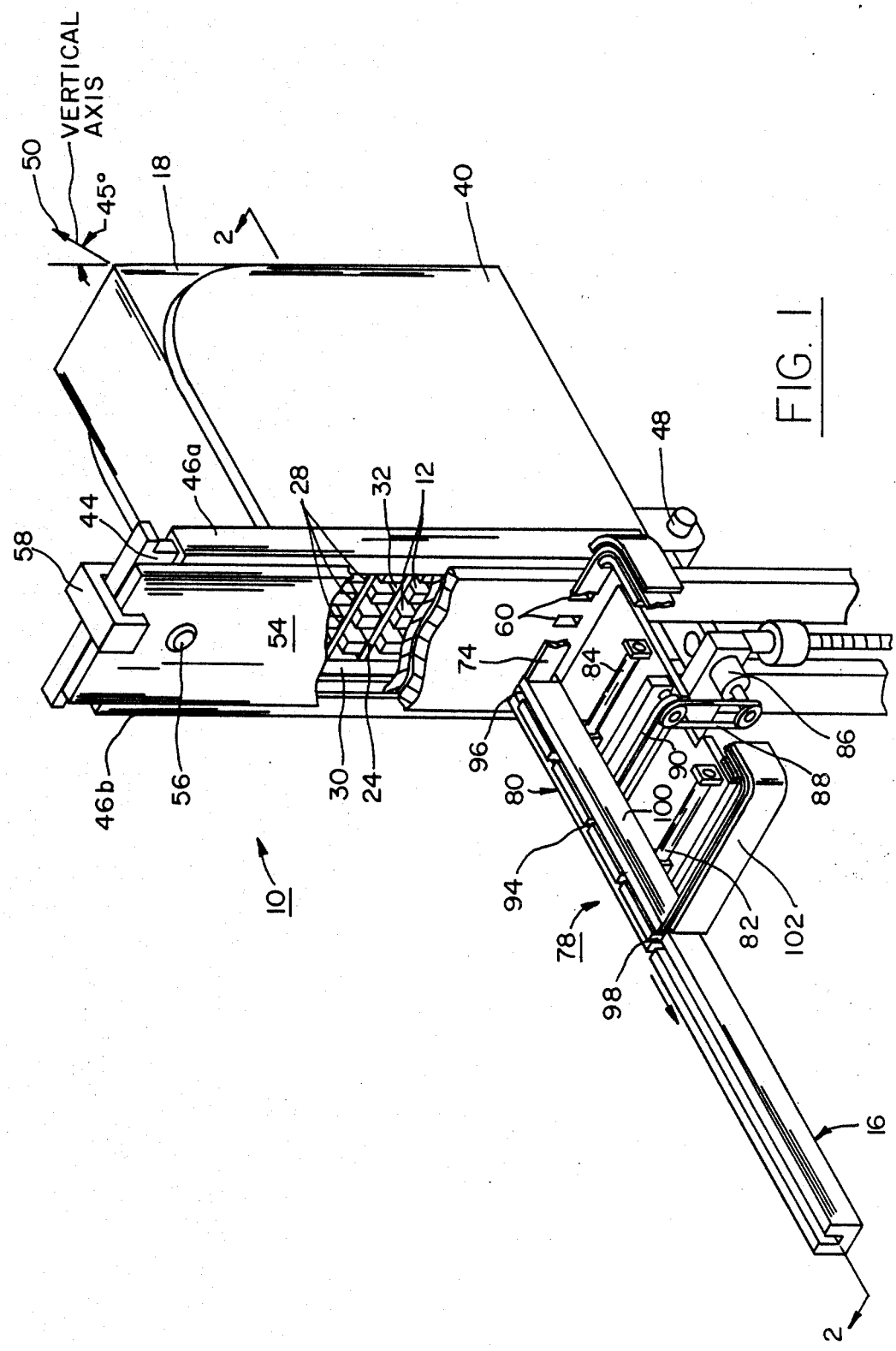
FIG. 1 is a perspective view of an apparatus according to the present invention for unloading a container having a three dimensional matrix of component storage positions. The apparatus is inclined at an angle of 45 degrees from a vertical axis.
Figure 2:
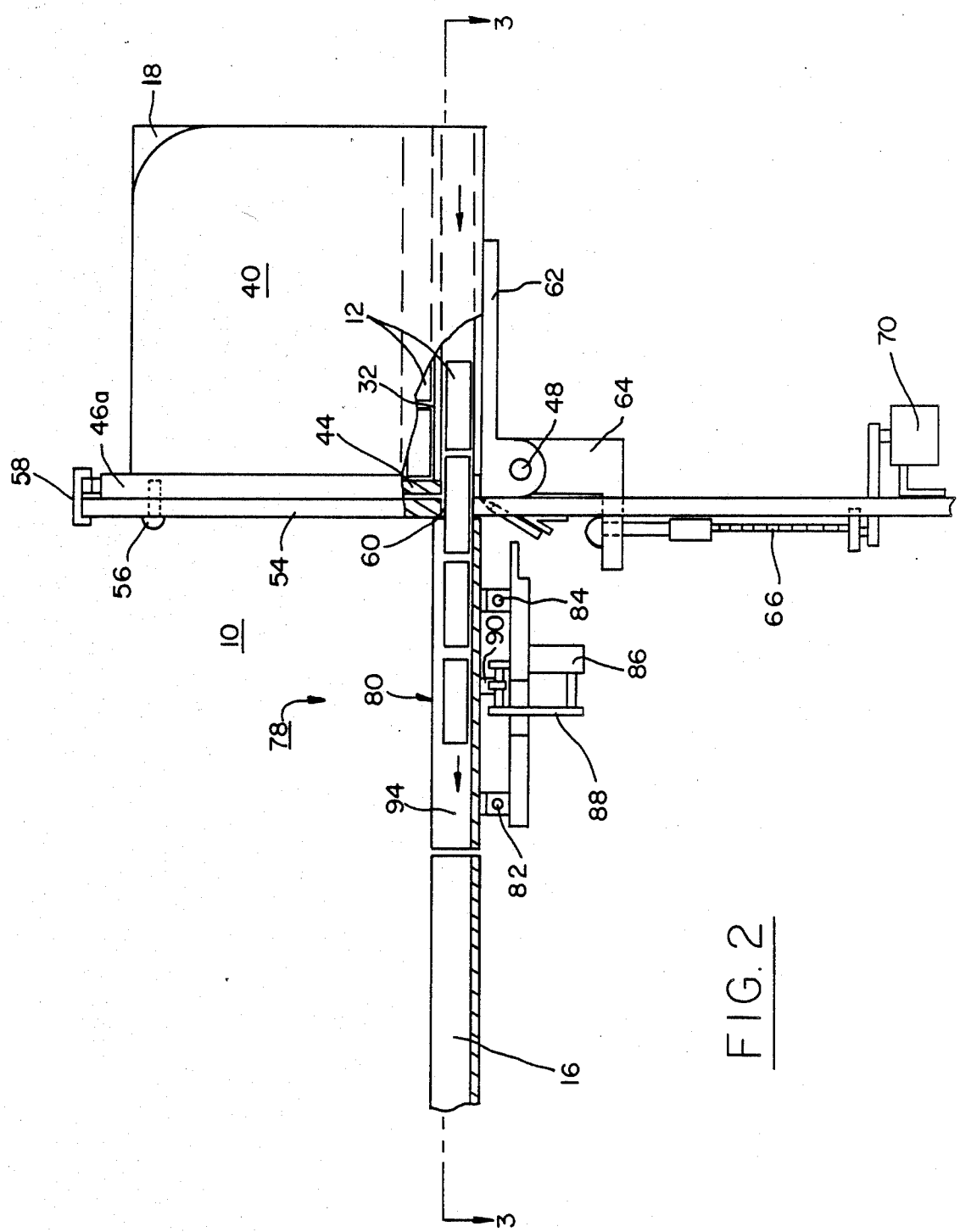
FIG. 2 is a cross-section elevational view of the arrangement of FIG. 1.
Figure 3:
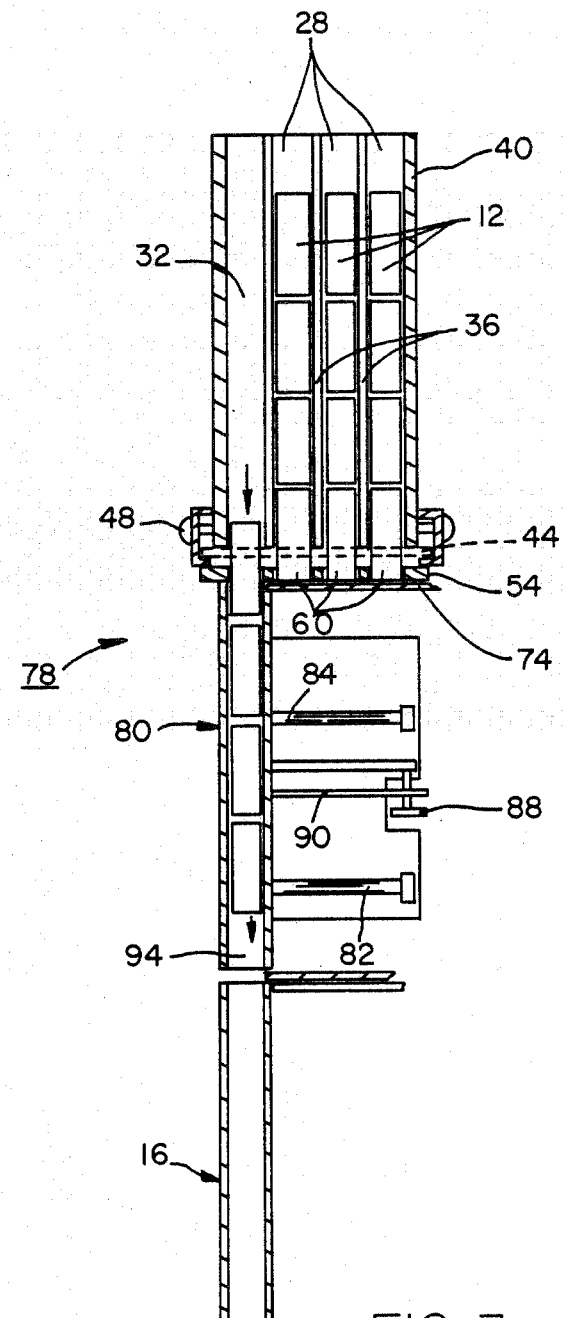
FIG. 3 is a plan view of the arrangements of FIGS. 1 and 2.

In the drawings, Figs. 1-3 illustrate an unloading apparatus generally designated at 10 constructed in accordance with the present invention. Apparatus 10 feeds solid components, such as electrical connectors 12, to a delivery track 16 for use in automated connector terminating equipment or the like (not show). In accordance with the invention, the connectors 12 are contained in a box-like container, generally designated as 18, which arranges a plurality of connectors in a three-dimensional matrix of feeding positions. As will be explained herein, box 18 holds a stacked array of open-ended trays, each tray having an equal number of channels for containing serial arrays of connectors 12.

The present invention can be employed in the handling and feeding of solid components, and particularly electrical connectors of many different types. In the preferred embodiment illustrated in the drawings, and as best illustrated in FIGS. 2 and 3, the connectors 12 are of a type adapted to be partly assembled at the point of manufacture and thereafter to be terminated and finally assembled at a different location. Each connector 12 includes a housing having several terminal receiving cavities in which conductive metal terminals may be inserted. The lower most surface of each connector 12 is suitable for sliding along a feed track.

In accordance with one important feature of the present invention, a number of electrical connectors 12 are contained in a plurality of trays 24 which are stacked one on top of another within box 18. Each tray 24 has a row of channels formed therein, each channel containing a serial array of connectors 12. The channels 28 and box 18 have open ends of which lie in a common plane, generally designated at 30. The ends of channels 28 lying in plane 30 each comprise a component feeding position which, when arranged in a matrix, completely fill the cross-section of box 18. Box 18 and trays 24 can therefore be described as a matrix container assembly. Alternative arrangements for providing a matrix of feeding positions are well known in the art, and can be employed with the present invention.

Each tray has a floor 32 for slideable engagement with the bottom surfaces of connectors 12. As is best shown in FIG. 3, each channel 28 has short, vertically extending guide walls 36 which are joined at one end to floor 32 to form a track having a generally U-shaped cross section.

In use, numerous connectors 12 are partly assembled to the intermediate condition illustrated in the drawings, typically by automated equipment which supplies the connectors one at time in a consistent and predetermined orientation. At this point in the manufacturing process, a number of the connectors are loaded into the open ends of each tray 24 until each channel 28 of the tray is substantially filled with connectors in a serial, side-by-side array with bottom surfaces slideably engaging the tray floor 32. In order to prevent connectors 12 from being accidently removed from the stack of trays 24, the open end of box 18 is temporarily closed, with a removeable wall panel (not shown in the drawings) which remains in place from the time of manufacture, until a time immediately prior to loading box 18 in apparatus 10.

Trays 24 and box 18 protect the connectors 12 while they are in their intermediate assembly condition. Delicate projecting portions such as metallic terminals extending outwardly from the connector bodies, cannot be deformed or damaged. In addition, any delicate projecting portions cannot be accidently removed from the intermediate to a final assembly position prior to termination. When the connectors 12 have been loaded into the trays 24, and box 18, they can be handled, shipped and stored in their oriented serial arrays without the necessity for reorienting the connectors at the time of termination and final assembly. This ensures that the connectors 12 are presented to apparatus 10 in a well defined predetermined configuration, wherein the trays 24 present a horizontal row of feeding positions corresponding to each channel 28. When trays 24 are stacked one on top of another, they present a matrix of feeding positions lying in a common plane 30, ready for dispensing by apparatus 10.

Unloading apparatus 10 dispenses electrical connectors 12 from trays 24 and box 18 and automatically delivers the connectors to a point of assembly, such as the delivery track 16 associated with automated terminating equipment or the like. Apparatus 10 supports a number of loaded trays 24, feeds connectors 12 from one tray at a time, and automatically indexes box 18 when one tray, is emptied, to present an adjacent loaded tray.

In the illustrated embodiment of the invention, apparatus 10 includes a box hopper 40, generally U-shaped in cross-section, having an open top and opposed open end walls. The temporary wall panel enclosing the front feeding end of box 18 is removed immediately prior to loading of box 18 in hopper 40. Thereafter, hopper 40 is pivoted away from a vertical axis, such that gravitational forces urge connectors 12 to slide in the channels of tray 28, toward the open ends thereof. To prevent an unintentional discharge of connectors 12 from the matrix of storage positions, a blocking plate 44 is aligned with box 18 to completely block the open end thereof, before hopper 40 is pivoted to impart a gravitational ejection force to the serial arrays of connectors located in channels 28. Blocking plate 44 is mounted between guide tracks 46a, 46b, which in turn are secured to the open end of hopper 40.

Hopper 40, blocking plate 44 and guide tracks 46a, 46b are configured to move as a unitary assembly which is pivotably mounted on shaft 48 for rotation in a vertical plane. The arrangement shown in FIG. 1 is displaced approximately 45 degrees from a vertical axis 50, with tray floors 32 providing a downhill surface along which the serial arrays of connectors 12 can slide so as to be dispensed from the matrix container assembly.

The box hopper assembly 40, blocking plate 44 and guide tracks 46a, 46b when pivoted, come to rest against a masking plate 54, which is fixably mounted at the inclined 45 degree angle, by structure not shown in figures. Thus, even though tilted in a downward direction, the plurality of connectors 12 are maintained in a matrix array by blocking plate 44, which is fixed in position by a pin 56 which joins masking plate 54 and blocking plate 44 together. Further securement is provided by U-shaped clamp 58 which prevents a reverse pivoting of the box hopper assembly 52 away from masking plate 54 during unloading of the storage assembly.

As can be seen in FIG. 2, blocking plate 44 is generally coextensive with the open end of box 18 and hopper 40. Masking plate 54, however, extends downwardly beyond the end of blocking plate 44 and in the preferred embodiment comprises the main support member for apparatus 10.

Masking plate 54 includes a horizontal array of funnel-shaped apertures 60, one communicating with each channel 28. When box 18 is initially loaded, apertures 60 are positioned below box hopper 40, which is advantageously mounted for vertical movement along masking plate 54. As can be seen in FIG. 2, box hopper 40 is mounted to a pivot plate 62 which is pinned to a riser block 64 by shaft 48. In turn, riser block 64 is supported by a ball screw arrangement 66 which is rotatably driven by a hopper drive motor 70. As motor 70 is energized, and ball screw 66 rotates, riser block 64 and box hopper 40 joined thereto, are moved along masking plate 54. In particular, once box 18 is loaded into hopper 40, motor 70 is energized so as to lower hopper 40, thereby exposing the lowermost row of channels (i.e., the lowermost tray 24) past the lowermost edge of blocking plate 44.

As hopper 40 is lowered, a first row of channels 28 is brought into alignment with the funnel-shaped apertures 60, and, owing to the gravity forces acting on the serial arrays of connectors 12 in each channel, the connectors shift toward plane 30 with the leading connector 12 being received in its corresponding funnel shaped aperture 60. The leading ends of a row of connectors 12 are received within apertures 60, and would continue their downward travel, but for the blocking effect of a flexible band-like stainless steel shutter 74, which selectively blocks apertures 60.

The next major subassembly of apparatus 10 is a shuttle assembly generally designated at 78, comprising a shuttle 80 which is mounted for reciprocation on slides 82, 84. Shuttle 80 is driven back and forth along slides 82, 84 by a drive motor 86 which is connected to shuttle 80 through drive chains 88, 90. Drive chain 90 is fixably attached to the underside of shuttle 80 and when rotated in opposite directions, drives shuttle 80 back and forth along slide 82, 84 as will be apparent to those skilled in the art.

Shuttle drive motor 86 is of a controlled type which is advanced in predetermined steps calibrated to align the axis of shuttle 80 with each aperture 60, and also with the axis of delivery track 16. Thus, shuttle drive motor 86 and its associated control circuitry (not shown in the figures) is capable of moving shuttle 80 through a sequence of positions corresponding to each aperture 60. Initially, shuttle 80 is located to the left of the "home" position as seen in FIG. 1.

Shuttle 80 includes a channel-like track 94 having a leading end 96 comprising a component discharge station, and a trailing end 98 comprising a component discharge station. Stainless steel shutter 74, attached to one side 100 of shuttle 80 adjacent the leading end thereof, follows the travel of shuttle 80 as it reciprocates back and forth along slide 82, 84. To balance out the frictional forces experienced by shutter 74, a dummy nonfunctional identical shutter 102 also attached to side 100 of shuttle 80 but at its trailing end 98. The second shutter 102 prevents jamming of shuttle 80 by maintaining forces between slides 82, 84 approximately equal to each other.

Initially, shuttle 80 is positioned to the left of that position shown in FIG. 1, with shutter 74 blocking the feed position aligned with the leftmost funnel-shaped opening 60. After loading of box 18 and hopper 40, hopper drive motor 70 is energized to lower hopper 40 and box 18, bringing the lowermost tray containing a row of channels, into alignment with funnel-shaped apertures 60, as described above. Shortly after, or concurrently therewith, shuttle drive motor 86 is energized to move shuttle 80 to the first feed position as indicated in FIG. 1, and to remove shutter 74 from blocking the left most aperture 60. This brings the first feed position of the leftmost channel 28 into alignment with shuttle 80. The serial array of connectors 12 are then free to slide along the bottom floor 32 of tray 24, into slot 94 of shuttle 80.

As indicated in the preferred embodiment of FIG. 1, the first feed position is also aligned with the delivery track 16, such that the first serial array of connectors is allowed to slide through shuttle 80 into delivery track 16 and onto its final destination. Thereafter, motor 70 is again energized moving shuttle 80 toward the right, into alignment with the next adjacent tray of channels, whereupon the next serial array of connectors is loaded into shuttle 80. In this position, however, the trailing end 98 of shuttle track 94 is blocked by the guide structure 103 of the second shutter 102.

At this time, the leftmost feed position is left unblocked, there being no connectors remaining in that tray channel. The channels toward the right of shuttle 80 containing serial arrays of connectors, are effectively blocked from discharge by shutter 74 and will retain blocked as long as shuttle 80 is not advanced further rightward. Shuttle drive motor 86 is then reversed, to bring shuttle 80 into alignment with delivery track 16 and the second serial array of connectors is discharged to their final destination along delivery track 16. Thereafter, under control of drive motor 86, shuttle 80 is moved to the third channel position to pick up yet another serial array of connectors. After returning to its home position for discharge into delivery track 16, shuttle 80 continues until all of the tray channels or feed positions of the first row are emptied. At this point, shuttle 80 is returned to its initial position blocking all of the apertures 60, and hopper motor 70 is energized to lower hopper 40 and box 18, bringing the next adjacent tray containing the next row of channels into alignment with funney-shaped apertures 60.

The above-described process of discharging the tray channels, one at a time, to delivery track 16, is repeated, until the second row of channels is emptied. This process is repeated until all of rows of box 18 are discharged into delivery track 16. When the box is emptied, drive motors 70, 86 are energized to return the box hopper to its uppermost position, and shuttle 80 to its home position, respectfully. At that point, an annunuciator, not shown in the drawings, indicates to an operator that box 18 is empty, and should be replaced with another box 18 filled with connectors 12. The operator then removes U-shaped clamp 58 and pin 56, rotating hopper 40 in a clockwise direction (with reference to FIGS. 1 and 2) whereupon box 18 is replaced with another box filled with connectors 12 and the process of pivoting hopper 40, locking plates 44, 54, and indexing hopper 40 and and shuttle 80 is repeated to discharge the contents of the current box-like container into delivery track 16.

The arrangement of the present invention can easily accommodate parts of different geometries, by replacing masking plate 54 to provide apertures 60 of the proper dimension, and by replacing the shuttle 80 and delivery track 16 to have the same corresponding dimensions. Drive motors 70, 86 can be easily reprogramed or recalibrated to accommodate the incremental index movements required.

Various control arrangements to provide the indicated operation of apparatus 10 will become! readily apparent to those skilled in the art. For example, hopper drive motor 70 can be geared such that hopper 40 is advanced at a relatively slow linear rate, and optical sensors positioned adjacent masking plate 54 can sense the present of an open end wall of a tray 28 brought into alignment with aperture 60. This signal can in turn initiate a de-energizing of xotor 70.

Shuttle drive motor can be controlled for further indexing to another aperture position upon the concurrence of a first signal indicating the absence of components in the current aperture 60, and the presence of components at the discharge end 98 of shuttle track 94. An additional signal, obtained when shuttle 80 is advanced toward the rightmost end position would indicate that an entire row has been emptied, and that shuttle 80 should return to its home position, with motor 70 being cycled to advance another tray position adjacent apertures 60.

Optical sensors positioned adjacent apertures 60 could sense the passage of the top most portion of box 18, indicating that the last, upper most tray is brought into a discharge position adjacent apertures 60. This signal, when combined with a signal indicating that the entire row has been discharged, could initiate return of shuttle 80 to its home position, with box hopper 40 being raised to its uppermost position and the aforementioned annunciator being operated to indicate to an operator that box 18 needs to be replaced.

The present invention also includes a method and apparatus for unloading a matrix array which is comprised of vertical rows and horizontal columns (comprised of rows stacked one immediately next to another). The necessary modifications to tne aforedescribed arrangement (where apparatus 10 rotated 90 degrees along an axis parallel to the delivery track), will become immediately apparent to those skilled in tne art. The plurality of funnel shaped apertures 60 will then lie along a vertical line and the shuttle will reciprocate in a vertical direction. The method of unloading such a matrix will also remain substantially identical to that described above. Thus, the present inventio is seen to encompass not only the loading of horizontally aligned rows, but also vertically aligned rows.

We claim:

1. An apparatus for unloading a plurality of electrical components to a delivery track having a loading station from a container, said apparatus comprising:
   a container having a front wall with a feed opening formed therein and including a matrix of electrical component-receiving channels disposed therein, each of said channels having an open front end defining channel openings at said feed opening to define a common plane including columns and rows of channel openings at said front wall, each channel extending rearwardly into the container from said feed opening and being adapted to sideably receive a longitudinal array of electrical components; and
   transfer means for successively transferring each array of electrical components from one channel at a time through each corresponding channel opening to said loading station, said transfer means including a shuttle assembly including a shuttle extending between said feed opening and said loading station, and having an electrical component-receiving slot including a receiving end and a discharge end, said shuttle being mounted for reciprocal movement along said feed opening;
   and means for alternately moving the shuttle between successive first positions wherein the receiving end of the electrical component-receiving slot is in alignment with a channel opening in one row in the feed opening and a second position wherein the discharge end is alignment with the loading station of the delivery track.

2. An unloading apparatus as in claim 1 wherein said transfer means further comprises masking means for covering all but one channel opening in the feed opening said masking means including,
   a masking plate covering said feed opening and disposed intermediate the front end container and the electrical component receiving end of the shuttle, said making plate including a row of apertures, each aperture communicating with each channel opening in said one row in the feed opening; and
   a masking shutter attached at one end to one side of the electrical component-receiving end of the shuttle and mounted for cooperative movement with the shuttle, said masking shutter being of the length and width sufficient to cover each aperture in the row in the masking plate located to said one side of the shuttle.

3. An unloading apparatus as in claim 2 wherein said transfer means further comprises a positioning means for positioning the container so that each row or channel openings in said feed opening in successively aligned with the row of apertures in the masking plate, said positioning means including: a mounting plate adapted to receive the container, mounted for vertical movement along the masking plate; and means for raising and lowering said mounting plate.

4. An unloading apparatus as recited in claim 1, wherein said matrix of electrical component-receiving channels is provided by an aligned vertical stack of open ended trays, each tray including a floor and a plurality of upstanding guide walls defining side by said channels of generally U-shaped cross section, open at one end.

* * * * *